United States Patent [19]

Balaban et al.

[11] 4,227,217
[45] Oct. 7, 1980

[54] MULTIPLEXING ARRANGEMENT FOR A TELEVISION SIGNAL PROCESSING SYSTEM

[75] Inventors: Alvin R. Balaban, Lebanon; Steven A. Steckler, Clark, both of N.J.

[73] Assignee: RCA Corporation, New York, N.Y.

[21] Appl. No.: 15,205

[22] Filed: Feb. 26, 1979

[51] Int. Cl.³ ............................................. H04N 5/50
[52] U.S. Cl. ................................ 358/192.1; 340/802; 340/814
[58] Field of Search ................ 358/192; 340/762, 814, 340/802; 325/455

[56] References Cited

U.S. PATENT DOCUMENTS

| 3,968,443 | 7/1976 | Leuschner | 325/455 |
| 4,005,369 | 1/1977 | Parisoe | 325/455 |
| 4,005,404 | 1/1977 | Soobik | 340/802 |
| 4,020,484 | 4/1977 | Caspari | 358/192 |
| 4,081,797 | 3/1978 | Olson | 358/192 |
| 4,123,713 | 10/1978 | Wine | 325/455 |
| 4,151,559 | 4/1979 | Merrill | 358/192 |
| 4,156,254 | 5/1979 | Marino | 340/814 |

OTHER PUBLICATIONS

"Magnavox Service Manual No. 7353", 703777 Videomatic Touch-Tune, Magnavox Company, 9-1976.

Primary Examiner—Robert L. Griffin
Assistant Examiner—Michael A. Masinick
Attorney, Agent, or Firm—Paul J. Rasmussen; Allen L. Limberg; Peter M. Emanuel

[57] ABSTRACT

A channel number display arrangement for a television receiver includes a multiplexer for alternately coupling binary signals representing the tens and units digits of the channel number of a selected channel to a single decoder and driver arrangement. To reduce visible effects of switching transients, the switching operation of the multiplexer is synchronized with respect to the receiver's deflection signals so that switching transients occur during horizontal retrace intervals in which the receiver's electron beams are normally blanked. In addition, keyed AGC circuitry, normally activated during the horizontal retrace intervals, is inhibited during the switching operation so that it is not erroneously set up in response to switching transients.

10 Claims, 2 Drawing Figures

MULTIPLEXING ARRANGEMENT FOR A TELEVISION SIGNAL PROCESSING SYSTEM

BACKGROUND OF THE INVENTION

The present invention pertains to the field of channel number display systems utilized in television receivers.

Television receivers which include tuners controlled in response to binary signals representing the channel number of a selected channel typically include a two-digit display for displaying the tens and units digits of the selected channel in response to the binary signals. Often, each digit of the display includes a seven-segment light emitting diode (LED) array. Since the binary signals representing the channel number typically include a group of four binary signals arranged in BCD (binary coded decimal) format for each digit, the display typically includes a decoder for each digit to convert the four binary signals representing the respective digit to seven binary signals for controlling the illumination of the seven segments of the respective array. In addition, the display also typically includes seven driver stages for each digit to translate the levels of the seven binary signals for controlling the illumination of the seven segments of the respective array to levels suitable for light emitting diodes. Thus, a typical channel number display includes two decoders and two sets of drivers.

Multiplexing arrangements for channel number displays are known in which the groups of binary signals representing the tens and units digits of the channel number are alternately processed by a single decoder and a single driver arrangement. Accordingly, only one decoder and one set of drivers is required for the channel number display, thereby effecting a cost and power consumption reduction. Unfortunately, since multiplexing involves the switching of signals, switching transients are generated which may undesirably affect the performance of a television receiver. For example, switching transients may exhibit themselves as spots in the picture produced by a receiver. Further, by way of example, switching transients may cause AGC (automatic gain control) circuits of the type which respond to the peak levels of signals to be erroneously set up, thereby causing gain levels of a receiver's RF and IF stages to be incorrectly controlled. While shielding, waveform shaping to slow down switching transients, and component placement techniques may be employed to minimize undesirable effects of switching transients, such techniques tend to increase the cost of receivers. In addition, where waveform shaping to slow down switching transients are employed, the power dissipation of the multiplexing arrangement tends to be increased.

SUMMARY OF THE PRESENT INVENTION

In accordance with the present invention, in a television receiver including multiplexing means for alternately coupling first and second signals or groups of signals representing, for example, the tens and units digits of a selected channel to processing means such as, for example, the decoder and driver arrangement for a channel number display for processing the first and second signals or groups or signals one at a time, synchronizing means are provided for synchronizing the multiplexing operation with the portion of an electron beam deflection signal when the electron beam is retraced and is inhibited from producing a visible image.

In accordance with another feature of the present invention, receiver circuitry normally activated during the retrace portion of the deflection signal, such as a keyed AGC circuit, is disabled during the multiplexing operation.

DETAILED DESCRIPTION OF THE DRAWING

Figure 1:
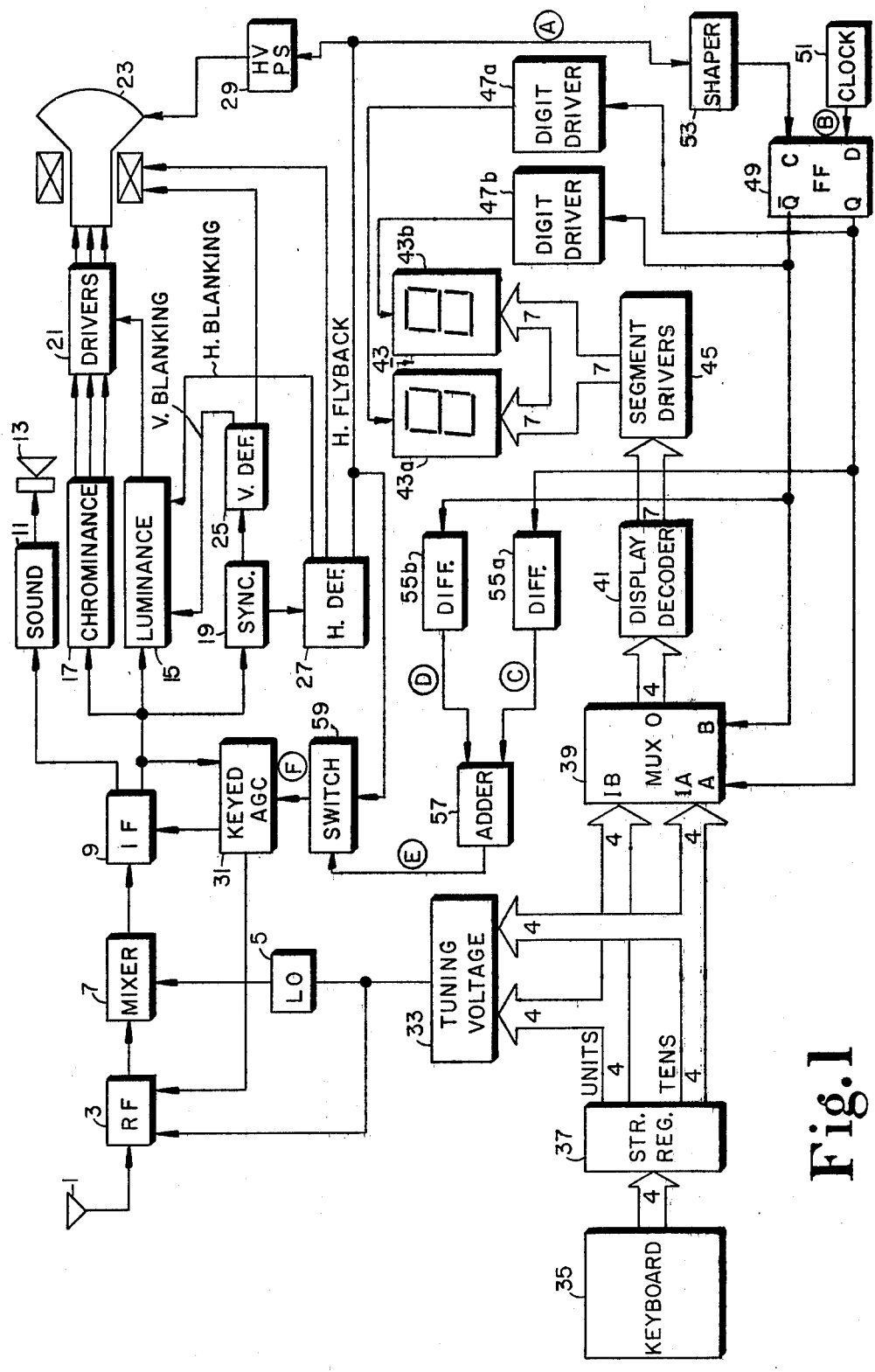
FIG. 1 shows in block diagram form a television receiver employing a multiplexing arrangement for a channel number display constructed in accordance with the present invention.

In the receiver shown in FIG. 1, RF carriers bearing television information are received by an antenna 1 and filtered and amplified by an RF unit 3. The RF signals are combined with a local oscillator signal generated by a local oscillator 5 in a mixer 7 to produce an IF signal. The IF signal is filtered and amplified by an IF unit 9 to produce a video signal and a sound signal. The sound signal is processed by a sound processing unit 11 and coupled to a speaker 13. The video signal is coupled to a luminance processing unit 15, a chrominance processing unit 17 and a synchronization processing unit 19. The chrominance processing unit 17 processes a chrominance component of the video signal to generate red, green and blue color-difference signals. The luminance component of the video signal is processed by luminance processing unit 15 and thereafter combined with the color-difference signals by respective drivers 21 to form red, green and blue color signals. The color signals are coupled to a picture tube 23 which, in response, generates respective electron beams.

Synchronization processing unit 19 separates horizontal and vertical synchronization pulses from the video signal and couples these to vertical and horizontal deflection units 25 and 27, respectively. Deflection units 25 and 27 generate vertical and horizontal deflection signals for controlling the deflection of the red, green and blue electron beams. The electron beams are horizontally scanned during trace and retrace intervals of the horizontal deflection signal and vertically scanned during trace and retrace intervals of the vertical deflection signal. In addition, deflection units 25 and 27 generate vertical and horizontal blanking pulses which begin slightly before and end slightly after the vertical and horizontal retrace intervals, respectively. The blanking pulses are coupled to luminance processing unit 15 to cause the three electron beams to be reduced in intensity so as not to produce visible lines during vertical and horizontal retrace intervals. Horizontal deflection unit 27 also generates a horizontal flyback pulse which corresponds in time to the horizontal retrace interval. The horizontal flyback pulse is coupled to a high voltage power supply 29 which generates the high operating voltages for kinescope 23.

The horizontal flyback pulse is also coupled to a keyed AGC (Automatic Gain Control) circuit 31. In response to the horizontal flyback pulses, keyed AGC circuit 31 is enabled to detect the peak amplitude of the horizontal synchronization pulses of the video signal, which occur in synchronism with the horizontal flyback pulses, and generates an AGC signal. The AGC signal is coupled to RF unit 3 and IF unit 9 to control their gain to compensate for the amplitude variations of the IF and RF signals.

An AGC arrangement suitable for use as keyed AGC unit 31 is described in U.S. Pat. No. 3,835,248 which is hereby incorporated by reference. The CA3153 integrated circuit available from RCA Corporation, Somerville, N.J., incorporates IF circuitry and keyed AGC circuitry similar to that disclosed in the aforementioned patent and is suitable for use in the receiver shown in FIG. 1. Finally, the RCA CTC-87 color television chassis, described in "RCA Television Service Data, File 1978, C-2" published by RCA Corporation, Indianapolis, Ind., hereby incorporated by reference, includes circuitry arranged in a manner similar to that so far described.

Local oscillator 5 is a voltage controlled oscillator having an oscillation frequency controlled in response to a tuning voltage. RF unit 3 includes voltage controlled tuning elements also controlled in response to the tuning voltage so as to track the frequency response to local oscillator 5. The tuning voltage is generated by a tuning voltage generator 33 in response to binary signals representing a selected channel number. Tuning voltage generator 33 may, for example, include a phase locked loop frequency synthesizer such as described in U.S. Pat. No. 4,031,549, which is hereby incorporated by reference.

First and second groups of four binary signals representing in BCD (binary coded decimal) format the tens and units digits of the channel number of the selected channel are sequentially generated in response to the sequential operation of the corresponding digit keys of a keyboard 35. The first and second groups of binary signals are coupled in the order generated to a respective group of stages of a storage register 37. The first and second groups of binary signals stored in storage register 37 are simultaneously coupled to tuning voltage generator 33 to determine the tuning voltage.

The first and second groups of binary signals stored in storage register 37 are also coupled to a channel number display system so that the channel number of the selected channel is displayed. However, the first and second groups of binary signals are not simultaneously coupled to the channel number display system, but are rather alternately coupled to it so that a single decoder and divider arrangement may be utilized to process each group. As a result, the number of components in the display system are reduced thereby effecting a reduction in cost and power consumption. Since the alternate coupling or multiplexing of signals inherently involves the generation of switching transients which may adversely affect the receiver's performance, the receiver shown in FIG. 1 includes multiplexing circuitry which is synchronously operated with respect to the deflection of the electron beams so that switching transients which do occur, occur at times when they will tend to produce the least noticeable effects.

Specifically, in the receiver shown in FIG. 1, a multiplexer 39 alternately couples the first and second groups of binary signals coupled to respective signal input ports IA and IB from storage register 37 to an output port O and thereby to a display decoder 41 in response to the high levels of respective first and second multiplexing signals coupled to respective control inputs A and B. The first and second multiplexing signals are generated in the manner described below so that their levels change during the horizontal retrace interval when the electron beams are normally inhibited from producing visible images. Decoder 41 responds to the first and second groups of four binary signals in the order received to alternately generate first and second groups of seven binary signals. The first and second groups of seven binary signals correspond to the arrays of seven light emitting diode segments of tens and units digit positions 43a and 43b, respectively, of channel number display unit 43. Segment drivers, indicated generally by reference number 45, amplify and shift the levels of the seven binary signals in the first and second groups of seven binary signals in the order received to generate respective first and second of seven drive signals for the segments of digit positions 43a and 43b, respectively. Since the seven drive signals generated at one time by drivers 45 are simultaneously coupled to both tens and units digit positions 43a and 43b, tens and units digit positions 43a and 43b are alternately enabled to respond to the corresponding one of the first and second groups of segment drivers in response to respective first and second digit drive signals. The first and second digit drive signals are generated by digit drivers 47a and 47b in response to the high levels of the first and second multiplexing signals, respectively.

Figure 2:
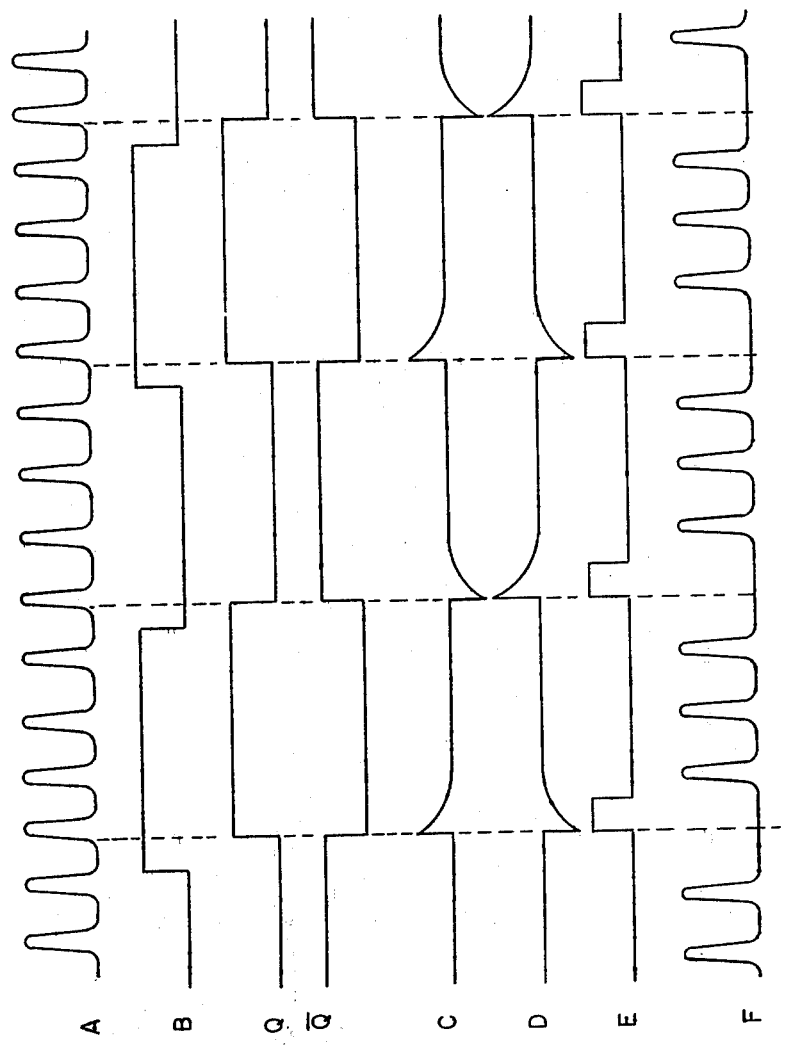
FIG. 2 shows graphical representations of waveforms useful in obtaining an understanding of the present invention.

The first and second multiplexing signals are generated by a D (data) flip-flop 49 in response to the horizontal flyback pulses and clock pulses generated by a clock pulse of a clock signal generator 51. At this point, reference to the waveforms shown in FIG. 2 will be helpful. The horizontal flyback pulses (waveform A) are processed by a shaper 53 to form pulses of suitable amplitude for D flip-flop 49 and coupled to the C (clock) input of D flip-flop 49. The clock signal (waveform B), which has a lower frequency than the frequency of the horizontal flyback pulses, is coupled to the D (data) input of D flip-flop 49. The first and second multiplexing signals (waveforms Q and $\bar{Q}$, respectively) are generated at the Q and $\bar{Q}$ outputs of D flip-flop 49. The levels of the first and second multiplexing signals are determined by the levels of the clock signal at the rising edges of the horizontal flyback pulses. Thus, the transitions of the first and second multiplexing signals are synchronous with the rising edges of the horizontal flyback pulses. The frequency of the first and second multiplexing signal is determined by the frequency of the clock signal which is desirably selected high enough, e.g., above 30 Hz, s there is substantially no flicker in the displayed channel number (i.e., the alternate enabling of the tens and units digit positions 47a and 47b, respectively, is not visibly noticeable).

Because keyed AGC circuit 31 may respond to switching transients which occur during the multiplexing operation rather than to the horizontal synchronization pulses and thereby generate an incorrect AGC signal, its operation is inhibited or suspended during the time the first and second multiplexing signals change levels. Specifically, the first and second multiplexing signals are differentiated by respective differentiating circuits 55a and 55b. The positive-going portions of differentiated signals (waveforms C and D) are added and shaped to form pulses in an adder 57 which may, for example, for this purpose include two diodes appropriately poled in the same direction between differentiating circuits 55a and 55b and the base of a transistor amplifier. The pulses of the resulting signal (waveform E) occur at times corresponding to the times both the first and second multiplexing signals change levels. In response to the pulses generated by adder 57, a switch 59 decouples the horizontal flyback pulses from keyed AGC circuit 31 (waveform F) thereby inhibiting its operation.

While the present invention has been described in terms of a channel number display system, it will be appreciated that it is also applicable in other display systems included in a television receiver, such as, for example, a display system for displaying the various components of time. Furthermore, while the present invention is particularly advantageous in multiplexing arrangements prone to generating relatively large switching transients, such as a multiplexing arrangement for an LED channel number display or a time display in which relatively high currents are switched, it is noted that the present invention is generally applicable to other multiplexing arrangements in television systems wherein first and second signals or groups of signals are selectively processed in the same manner by a single processing unit. Finally, while the operation of multiplexing arrangements for television channel or time display systems are desirably synchronized with respect to the horizontal retrace interval to minimize display flicker, in other television multiplexing arrangements where flicker is not a critical factor, the multiplexing arrangement may be synchronized with respect to the lower frequency vertical retrace interval.

What is claimed is:

1. In a television receiver including signal processing means for generating a video signal including picture and synchronization signal components, deflection means responsive to said synchronization signal components for generating horizontal and vertical deflection signals including horizontal trace and retrace intervals and vertical trace and retrace intervals for controlling the deflection of at least one electron beam and horizontal and vertical blanking pulses in substantial synchronization with said horizontal and vertical retrace intervals, respectively, said signal processing means including blanking means for inhibiting the generation of said electron beam in response to said horizontal and vertical blanking pulses, apparatus comprising:

information generating means for generating at least first and second groups of binary signals representing first and second information components;

conversion means for converting said first and second groups of binary signals when received to first and second groups of display control signals, respectively;

first and second display means for displaying first and second symbols related to said first and second information components, respectively, in response to said first and second groups of display control signals, respectively, when enabled; and switching means coupled to said deflection means for generating a multiplexing signal having pulses with transitions occurring during selected ones of said blanking pulses of one of said horizontal and vertical deflection signals; and multiplexing means for periodically coupling said first and second groups of binary signals to said conversion means and respectively enabling said first and second display means to respond to said first and second groups of display control signals, respectively, in response to pulses of said multiplexing signal.

2. The apparatus recited in claim 1 wherein:

said switching means includes clock means for generating a clock signal comprising clock pulses; and synchronizing means responsive to said clock signal and coupled to said deflection means for generating said pulses of said multiplexing signal at a frequency substantially equal to the frequency of said clock pulses.

3. The apparatus recited in claim 2 wherein:

said transitions of said pulses of said multiplexing signal occur during selected ones of said transitions of said blanking pulses of said horizontal deflection signal.

4. The apparatus recited in claim 3 wherein:

said signal processing means includes automatic gain control means for generating an automatic gain control signal in response to the peak amplitude of said synchronizing signal component during said horizontal retrace intervals; and said multiplexing means includes inhibiting means for inhibiting the operation of said automatic gain control means in response to said transitions of said pulses of said multiplexing signal.

5. The apparatus recited in claim 4 wherein:

said synchronization means is responsive to horizontal flyback pulses generated by said deflection means during said horizontal retrace intervals and said clock signal to generate said multiplexing signal.

6. The apparatus recited in claim 5 wherein:

said clock signal has a lower frequency than said horizontal deflection signal component;

said synchronizing means includes flip-flop means for generating first and second complementary binary multiplexing signals having first and second levels dependent on the levels of said clock signal when said horizontal flyback pulses are generated; and said multiplexing means couples said first group of binary signals to said conversion means, decouples said second group of binary signals from said conversion means, enables said first display means and disables said second display means in response to the first level of said first multiplexing signal; said multiplexing means couples said second group of binary signals to said conversion means, decouples said first group of binary signals from said conversion means, enables said second display means and disables said first display means in response to said first level of said second multiplexing signal.

7. The apparatus recited in claim 6 wherein:

said inhibiting means includes first differentiator means for differentiating said first multiplexing signal when it changes from said second level to said first level to generate a first differentiated signal; second differentiation means for differentiating said second multiplexing signal when it changes from said second level to said first level to generate a second differentiated signal; and adder means for combining said first and second differentiated signals to generate an inhibiting signal for inhibiting said automatic gain control means.

8. The apparatus recited in claim 4 wherein:

said first and second groups of binary signals represent in binary coded decimal format the tens and units digits of the number of a selected television channel; and said first and second display means display said tens and units digits, respectively, of said number.

9. The apparatus recited in claim 8 wherein:

said first and second display means each include an array of seven segments arranged to form numerals, said segments being activated in response to respective ones of said display control signals; and said conversion means includes decoder means for generating seven binary signals corresponding to respective segments of said first and second display means in response to said first and second groups of said binary signals arranged in binary coded decimal format, respectively; and driver means for generating seven display control signals for actuating respective segments of said first and second display means, respectively, in response to said first and second groups of said seven binary signals, respectively.

10. The apparatus recited in claim 9 wherein:
said first and second display means each include an array of seven light emitting diode segments.

* * * * *